(12) United States Patent
Fukuma et al.

(10) Patent No.: US 8,790,797 B2
(45) Date of Patent: Jul. 29, 2014

(54) SPIN INJECTION SOURCE AND MANUFACTURING METHOD THEREOF

(75) Inventors: Yasuhiro Fukuma, Wako (JP); Yoshichika Otani, Wako (JP)

(73) Assignee: RIKEN, Saitama (JP)

( * ) Notice: Subject to any disclaimer, the term of this patent is extended or adjusted under 35 U.S.C. 154(b) by 81 days.

(21) Appl. No.: 13/223,785

(22) Filed: Sep. 1, 2011

(65) Prior Publication Data

US 2012/0058367 A1    Mar. 8, 2012

(30) Foreign Application Priority Data

Sep. 2, 2010    (JP) .................................. 2010-197047

(51) Int. Cl.
| | |
|---|---|
| G11B 5/39 | (2006.01) |
| G03F 7/20 | (2006.01) |
| G11C 11/16 | (2006.01) |
| H01L 29/66 | (2006.01) |
| G01R 33/09 | (2006.01) |

(52) U.S. Cl.
CPC ................ G11C 11/161 (2013.01); *G11B 5/39* (2013.01); *H01L 29/66984* (2013.01); *G01R 33/098* (2013.01)
USPC ..................................................... 428/811.1

(58) Field of Classification Search
None
See application file for complete search history.

(56) References Cited

U.S. PATENT DOCUMENTS

| | | | | |
|---|---|---|---|---|
| 8,405,134 | B2 * | 3/2013 | Yuasa ............................ | 257/295 |
| 2006/0176735 | A1 | 8/2006 | Yuasa | |
| 2009/0052237 | A1 * | 2/2009 | Morise et al. ................. | 365/171 |
| 2009/0057654 | A1 * | 3/2009 | Saito et al. ...................... | 257/39 |
| 2009/0324814 | A1 * | 12/2009 | Parkin ............................ | 427/131 |
| 2010/0073828 | A1 | 3/2010 | Wang et al. | |
| 2010/0078310 | A1 | 4/2010 | Tsunekawa et al. | |

FOREIGN PATENT DOCUMENTS

| | | |
|---|---|---|
| JP | 2004-186274 | 7/2004 |
| JP | 2004-342241 | 12/2004 |
| JP | 2005-019561 | 1/2005 |
| JP | 2005-135462 | 5/2005 |
| JP | 2006-210391 | 8/2006 |
| JP | 2007-155854 | 6/2007 |
| JP | 2007-294710 | 11/2007 |
| JP | 2009-059807 | 3/2009 |
| JP | 2010-074171 | 4/2010 |
| JP | 2010-109319 | 5/2010 |

OTHER PUBLICATIONS

Fukuma, Y., Want, L., Idzuchi, H., and Y. Otani, App. Phys. Let., 97, 012507, 2010, pp. 012507-1-012507-3.*
Y. Fukuma, et al., "Enhanced spin accumulation obtained by inserting low-resistance MgO interface in metallic lateral spin valves", Applied Physics Letters, vol. 97, 012507 (2010).
S. Takahashi and S. Maekawa, "Spin injection and detection in magnetic nanostructures", Physical Review B, vol. 67, 052409 (2003).
S.O. Valenzuela and M.Tinkham, "Spin-polarized tunneling in room-temperature mesoscopic spin valves", Applied Physics Letters, vol. 85, No. 24 (2004).

* cited by examiner

*Primary Examiner* — Kevin Bernatz
(74) *Attorney, Agent, or Firm* — Nixon & Vanderhye P.C.

(57) ABSTRACT

The spin injection source comprises a nonmagnetic conductor, an MgO film, and a ferromagnet, and injects spin from the ferromagnet to the nonmagnetic conductor. The MgO film is annealed at temperature of between 300° C. and 500° C. The annealing duration is preferably between 30 and 60 minutes. By annealing, the oxygen vacancies increases and the electric resistance of MgO film decreases. And thus the spin injection efficiency in the spin injection source improves.

4 Claims, 16 Drawing Sheets

FILM THICKNESS DEPENDENCE OF MgO INTERFACE RESISTANCE (A)

21: NONMAGNETIC ELECTRODE
22,24: MgO LAYER
23,25: FERROMAGNETIC ELECTRODE (B)

(C)

11: FERROMAGNET/MgO ELECTRODE FOR SPIN INJECTION
12: FERROMAGNET/MgO ELECTRODE FOR SPIN DETECTION
13,14: NONMAGNETIC THIN WIRE FOR SPIN ACCUMULATION
15,16,17,18: NONMAGNETIC ELECTRODE FOR MEASUREMENT

|—————| 40 nm

33: NONMAGNETIC THIN WIRE FOR SPIN ACCUMULATION (Ag)
32: MgO LAYER
31: FERROMAGNET LAYER (NiFe)

APPLIED CURRENT DEPENDENCE OF SPIN ACCUMULATION AMOUNT IN SPIN ACCUMULATION DEVICE USING SPIN INJECTION SOURCE OF EXAMPLE (d=300nm)

APPLIED CURRENT DEPENDENCE OF $\Delta R_s$
IN SPIN ACCUMULATION DEVICE USING SPIN INJECTION SOURCE
OF EXAMPLE (d=300nm)

INJECTION-DETECTION ELECTRODE DISTANCE DEPENDENCE OF ΔV IN SPIN ACCUMULATION DEVICE USING SPIN INJECTION SOURCE OF EXAMPLE

APPLIED CURRENT DEPENDENCE OF SPIN POLARIZATION Pi, PF
AND SPIN DIFFUSION LENGTH OF SILVER
IN SPIN ACCUMULATION DEVICE USING SPIN INJECTION SOURCE
OF EXAMPLE

ANNEAL TEMPERATURE DEPENDENCE OF $\Delta R_S$
(JUNCTION AREA IS VARIED BY CHANGING WIDTH OF NONMAGNETIC THIN WIRE)

ANNEAL TEMPERATURE DEPENDENCE OF
SPIN POLARIZATION OF MgO INTERFACE AND
SPIN DIFFUSION LENGTH OF SILVER
(JUNCTION AREA IS VARIED BY CHANGING WIDTH OF
NONMAGNETIC THIN WIRE)

(A) CROSS-SECTIONAL TEM IMAGE AND
(B-E) COMPOSITION AREA ANALYSIS RESULTS OF
SPIN ACCUMULATION DEVICE ANNEAL AT 500° C (A)

(B) O (D) Fe (C) Mg (E) Ni

SPIN INJECTION SOURCE AND MANUFACTURING METHOD THEREOF

BACKGROUND OF THE INVENTION

1. Field of the Invention

The present invention relates to spin injection sources with high spin injection efficiencies and their manufacturing methods.

2. Description of the Background Art

Spintronics is an emerging technology that deals with the intrinsic spin of the electron and aims for creation of new high-functional devices utilizing the spin, and has potential to break the limits of conventional semiconductor devices. For example, the application of spin accumulation devices (devices utilizing the spin accumulation effect) for reading heads on hard disk drives or nonvolatile magnetic memories is expected to realize memory density of 1 Tbit/inch$^2$. However, the output signal of a conventional spin accumulation device is reported to have a value of several $\mu V$ typically, and of several tens of $\mu V$ at best. Increasing the weak signal is a key factor for practical application.

In a lateral spin valve, the spin is injected and accumulated in the nonmagnet by passing an electric current through the junction interface between the nonmagnet and ferromagnet. There are two types of junction interfaces in the lateral spin valve: ohmic junction and tunnel junction. The ohmic junction has a ferromagnet and a nonmagnet directly joined together, and its interface resistance is small. Here, since the ferromagnet has a small spin resistance and the nonmagnet has a large spin resistance, there is a spin resistance mismatch. Due to the mismatch, an effective spin injection is difficult, and the spin accumulation resistance change $\Delta R_S$ is as small as 1 m$\Omega$. The tunnel junction has an insulating layer between the ferromagnet and the nonmagnet, and its interface resistance is large. Since the tunnel junction overcomes the spin resistance mismatch, it may exhibit larger $\Delta R_S$. However, since an increase in the applied voltage decreases the spin injection efficiency, the spin valve signal voltage may not become so large.

In Y. Fukuma, et al., "Enhanced spin accumulation obtained by inserting low-resistance MgO interface in metallic lateral spin valves", Applied Physics Letters, vol. 97, 012597 (2010), the inventors have reported that even if a layer of lower resistance MgO than that in the conventional tunnel junction is used in a spin injection device made of a ferromagnet (NiFe) MgO, a nonmagnet (Ag), the problem of the spin resistance mismatch may be overcome. The electric resistance of the MgO layer is two orders smaller than that used in the conventional tunnel junction. Since the spin accumulation voltage is a product of the spin accumulation resistance change and the current ($\Delta V = \Delta R_S \times I$) and a larger current can be applied to low-resistance MgO, the spin valve signal may become larger.

SUMMARY OF THE INVENTION

The object of the present invention is to provide a spin injection source having improved spin injection efficiency.

In order to achieve the above-described object, the spin injection source according to a first aspect of the present invention comprises a nonmagnetic conductor; a low-resistance MgO film formed on the nonmagnetic conductor; and a ferromagnet formed on the nonmagnetic conductor; and the MgO film is annealed at temperature of between 300° C. and 500° C. The annealing is preferably performed for between 30 and 60 minutes.

The spin injection source according to a second aspect of the present invention comprises a nonmagnetic conductor; a low-resistance MgO film formed on the nonmagnetic conductor; and a ferromagnet formed on the nonmagnetic conductor; and the oxygen in the MgO film is decreased by 5% to 17%.

The spin injection source according to a third aspect of the present invention comprises a nonmagnetic conductor; a low-resistance MgO film formed on the nonmagnetic conductor; and a ferromagnet formed on the nonmagnetic conductor; and the interface resistance $R_I$ (f$\Omega$m$^2$) and the thickness t (nm) of the MgO film satisfy the following relationship.

$$R_I \propto e^{\alpha - 1}, 0.7 \leq \alpha \leq 1.2$$

The spin injection source according to a fourth aspect of the present invention comprises a nonmagnetic conductor; a low-resistance MgO film formed on the nonmagnetic conductor; and a ferromagnet formed on the nonmagnetic conductor; and the MgO film has an interface resistance of 1 to $10^3$ f$\Omega$m$^2$ and a thickness of 2 nm or more.

As a fifth aspect of the present invention, a manufacturing method of a spin injection source for injecting spin from a ferromagnet to a nonmagnetic conductor which comprises a nonmagnetic conductor, a low-resistance MgO film formed on the nonmagnetic conductor, and a ferromagnet formed on the nonmagnetic conductor, the method comprising the steps of: forming a multi-layer structure of a nonmagnetic conductor, a MgO film, and a ferromagnet laminated in this order; and annealing the MgO film at between 300° C. and 500° C.

The spin injection source of the present invention improves the spin injection efficiency.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

<Configuration>

Figure 1:
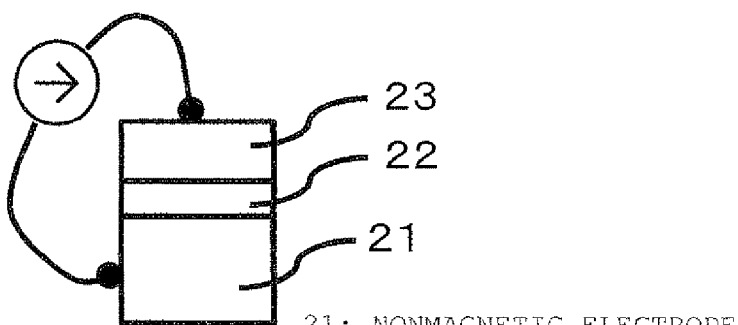
FIG. 1 is a diagram showing the basic configuration of the spin injection source of a embodiment.
Figure 1:
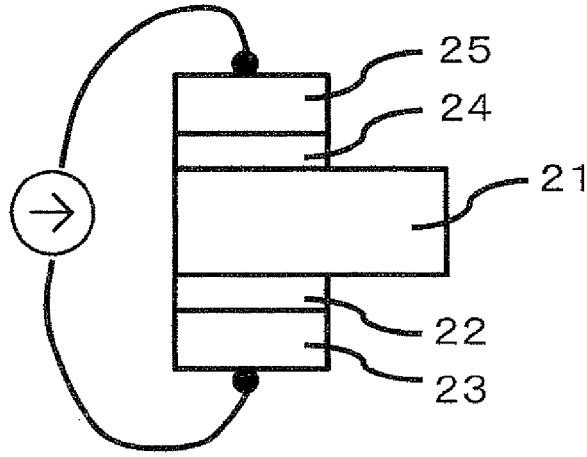
Figure 1:
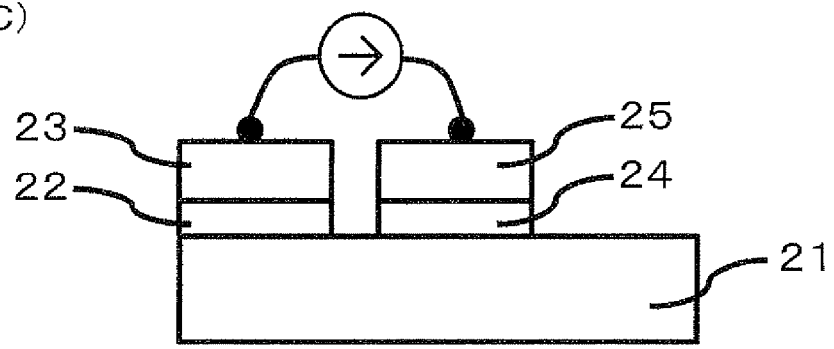

The basic configuration of the spin injection source according to the present invention is, as shown in FIG. 1A, a three-layer structure of the nonmagnet 21, low-resistance MgO layer 22, and ferromagnet 23. When a voltage is applied between the nonmagnet 21 and ferromagnet 23, the spin is injected in the nonmagnet 21 through the low-resistance MgO layer 22. The number of the spin injector electrodes depends on the purpose of the device configuration or device function. In FIG. 1B, two electrodes are provided on both surfaces of the nonmagnet: one electrode is a pair of the low-resistance MgO layer 22 and ferromagnet 23 and the other is a pair of the low-resistance MgO layer 24 and ferromagnet 25. Here, the spin is injected in the nonmagnet 21 by applying a voltage between the ferromagnets 23 and 25. In FIG. 1C, two electrodes are provided on the same surface of the nonmagnet: one electrode is a pair of the low-resistance MgO layer 22 and ferromagnet 23 and the other is a pair of the low-resistance MgO layer 24 and ferromagnet 25. The spin is injected in the nonmagnet 21 by applying a voltage between the ferromagnets 23 and 25.

The spin injection sources in FIGS. 1B and 1C use two spin injection electrodes, so the spin accumulation amount in the nonmagnet 21 is twice as large as that in the spin injection source of FIG. 1A. To achieve this, the magnetization directions of the ferromagnet 23 and ferromagnet 25 need to be anti-parallel. It is because the current flows oppositely in two spin injection electrodes: in one electrode the current flows through from the ferromagnet to the nonmagnet and in the other electrode the current flows through from the nonmagnet to the ferromagnet. The direction of the spin accumulated in the nonmagnet layer depends on the magnetization direction of the ferromagnet and the current direction. If the magnetization directions of the ferromagnets 23 and 25 were the same, since the currents flows oppositely in the nonmagnet, the spin injected in the nonmagnet 21 from the spin injection electrodes would be cancelled. With the anti-parallel magnetization directions of the ferromagnets 23 and 25, the direction of the spin injected in the nonmagnet 21 from the spin injection electrodes become the same, and twice as large spin current is injected in the nonmagnet as compared with FIG. 1A.

The materials adoptable to the ferromagnets 23 and 25 include Ni, Fe, Co, alloys thereof, amorphous materials such as Co—Fe—B, Heusler materials such as Co—Mn—Si and Co—Cr—Fe—Al, oxide materials such as La—Sr—Mn—O, and ferromagnetic semiconductor materials such as GaMnAs. One of the listed materials may be selected to form the ferromagnetic thin film, or also the film may be a multi-layered film consists of two or more materials. Also, the ferromagnets may be doped with a nonmagnetic element such as Ti, V, Cr, Mn, Cu, Zn, B, Al, G, C, Si, Ge, Sn, N, P, Sb, O, S, Mo, Ru, Ag, Hf, Ta, W, Ir, Pt, and Au in order to control the magnetic and chemical characteristics.

Here, the thicknesses of the ferromagnet layer are preferably 2 nm or more, in consideration of the noise and magnetic characteristics at the time of reading. Also, in order to firmly fix the magnetization direction of the ferromagnet in a particular direction, the antiferromagnetic layer such as MnIr, MnPt, and MnRh may preferably be provided on the ferromagnet.

The nonmagnet 21 may be a nonmagnetic conductive metal selected from the group consisting of Cu, Au, Ag, Pt, Al, Pd, Ru, Ir, and Rh, a conductive compound consisting primarily of GaAs, Si, TiN, and TiO, or the like.

The low-resistance MgO layers 22 and 24 are annealed after deposition to increase the oxygen vacancies and decrease the interface resistance. The spin injection source of the present invention is different from that of Fukuma et. al., 2010 (hereafter referred to as "comparative example") in that it is annealed. The characteristics of the low-resistance MgO layer according to the embodiment will be discussed in detail after an explanation of the manufacturing method of the spin injection source.

<Manufacturing Method>

Here, the manufacturing method of the spin injection source according to the embodiment will be explained. The spin injection source is prepared on a Si substrate, a glass substrate, or a MgO substrate.

When forming by lift-off process, first, the resist is coated on the substrate. Then, the electrode pattern for the spin injection source is fabricated by an electron beam lithography device or a stepper, which pattern may take any form. The pattern of the detection electrode is fabricated at the same time as the injection electrode pattern, for the detection electrode is necessary in practical use. The substrate formed with the fine line pattern is conveyed in the ultra-high vacuum thin film equipment. In order to obtain the configuration shown in FIG. 1A or FIG. 1C, the nonmagnetic thin film 21, MgO thin films 22 and 24, and ferromagnetic thin films 23 and 25 are formed in series. In order to obtain the configuration shown in FIG. 1B, the ferromagnetic thin film 23, MgO thin film 22, non-magnetic thin film 21, MgO thin film 24, and ferromagnetic thin film 25 are formed in series. For the ferromagnet films and nonmagnet films, the above-described materials may be employed. Thin film forming technique may be any of sputter deposition, electron beam physical vapor deposition, and molecular beam deposition, depending on the film material. Since the oxygen vacancies need to be introduced into the MgO thin films 22 and 24, they should be deposited in ultra-high-vacuum condition using the single- or multi-crystal MgO as a deposition source. The oxygen vacancies amount can be controlled by adjusting the supply power to the deposition source. Far example, when they are heated to the higher temperature, the more oxygen vacancies are introduced into them. Further, when a complicated configuration is needed, the incident angle of depositing elements to the substrate should be adjusted by controlling the relative angle between the deposition source and substrate with a three-dimensional lift-off pattern using multi-layer resist configuration (for example, MMA/PMMA). After preparing the thin film, the spin injection source is obtained by lift-off process.

As an alternative method, the spin injection source may be formed by etching process such as ion milling. In order to obtain the configuration shown in FIG. 1A, the multi-layer configuration of nonmagnet/MgO/ferromagnet is prepared on the substrate. Thin film forming technique may be any of sputter deposition, electron beam physical vapor deposition, and molecular beam deposition, depending on the film material. Since the oxygen vacancies need to be introduced into the MgO thin films 22 and 24, they should be deposited in ultra-high-vacuum condition using the single- or multi-crystal MgO as a deposition source. After coating the resist on the multi-layer film, the electrode pattern for the spin injection source is fabricated by an electron beam lithography device or a stepper, which pattern may take any form. Then, the spin injection source may be obtained by Ar ion milling for example.

In order to obtain the configuration shown in FIG. 1B, first, the ferromagnet/MgO film is prepared on the substrate. After coating the resist on the MgO film and drawing the bottom spin injection electrode configuration by an electron beam lithography device or a stepper, the bottom injection electrodes (22 and 23) are cut out by Ar ion milling. Then, the MgO is subject to surface cleaning process to form the nonmagnetic thin film. The resist is coated on the nonmagnetic thin film and the nonmagnet configuration is drawn by an electron beam lithography device or a stepper, and the nonmagnetic electrode 21 is cut out by Ar ion milling. Then, the nonmagnetic electrode is subject to surface cleaning process to form MgO/ferromagnet film. The resist is coated on the ferromagnetic thin film and the top spin injection electrode configuration is drawn by an electron beam lithography device or a stepper, and the top spin injection electrodes (24 and 25) are cut out by Ar ion milling. Further, multi-layer configuration may be formed by repeating the above process. As mentioned before, magnetization of the ferromagnets 23 and 25 should be made anti-parallel each other using a magnetic field or the like.

In order to obtain the configuration shown in FIG. 1C, the nonmagnet film is prepared on the substrate. After coating the resist on the nonmagnet thin film and drawing the nonmagnet electrode configuration by an electron beam lithography device or a stepper, the nonmagnet electrode 21 is cut out by Ar ion milling. Then, the nonmagnet is subject to surface cleaning process to form the MgO/ferromagnet film. The resist is coated on the nonmagnetic thin film and the top spin injection electrode configuration is drawn by an electron beam lithography device or a stepper, and the first spin injection electrode (22 and 23) and second spin injection electrode (24 and 25) are cut out by Ar ion milling. Also in this case, the relative direction of the magnetization directions of the ferromagnets 23 and 25 should be made anti-parallel.

After the deposition of the MgO layer or production of the device configuration by any of above method, in order to increase the amount of oxygen vacancies, the MgO layer will be annealed in a high-vacuum condition (of about $10^{-5}$ Torr) or in a hydrogen atmosphere (nitrogen (97%) hydrogen (3%)). Annealing at 300 to 500° C. for 30 to 60 minutes is preferable in general, but it may depend on the device configuration and material.

EXAMPLE

Figure 2:
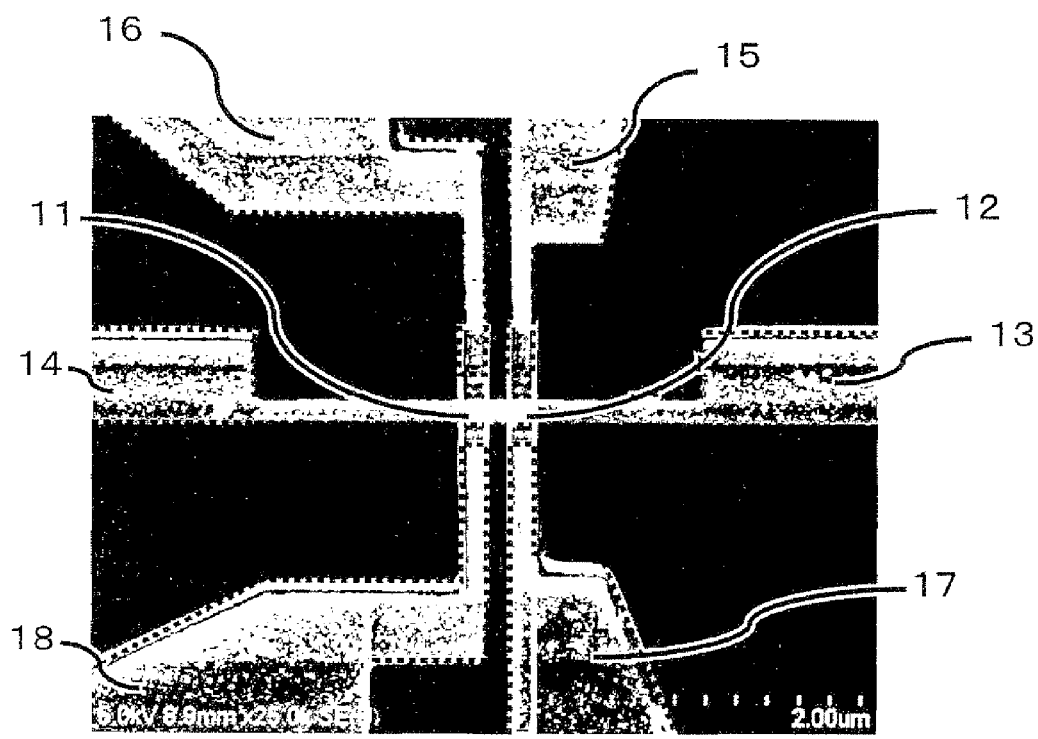
FIG. 2 is a diagram showing a scanning electron microscopic image of the spin accumulation device of an example.

A spin accumulation device shown in FIG. 2 is prepared for evaluating the spin injection source characteristics. FIG. 2 shows a scanning electron microscope (SEM) image of the prepared spin accumulation device. The spin injection electrode 11 corresponds to the spin injection source of the present invention. The spin detector electrode 12 is also provided for evaluating the spin injection source. Below, the manufacturing method of the spin accumulation device shown in FIG. 2 will be described. First, a two-layer (MMA/PMMA) electron beam resist is prepared on a Si/SiO$_2$ substrate. The device configuration pattern is drawn using an electron beam lithography device. Then, the substrate is conveyed in an ultrahigh-vacuum deposition device (about $10^{-8}$ Torr), and a NiFe (Py) film of 20 nm thickness, an MgO film of 8 nm thickness, and an Ag film of 50 nm thickness are prepared on the substrate by electron beam deposition. Here, in order to obtain the ferromagnet/MgO electrode 11 for injection and ferromagnet/MgO electrode 12 for detection, incident angle of the NiFe film and MgO film to the substrate is made 45 degrees. Ag film is deposited with the incident angle of 90 degrees as normal. After lifting-off, the device configuration shown in FIG. 2 can be obtained. Then, it is annealed in a nitrogen (97%)+hydrogen (3%) atmosphere at 400° C. for 30 minutes. (Details of the annealing condition will be described later).

Figure 3:
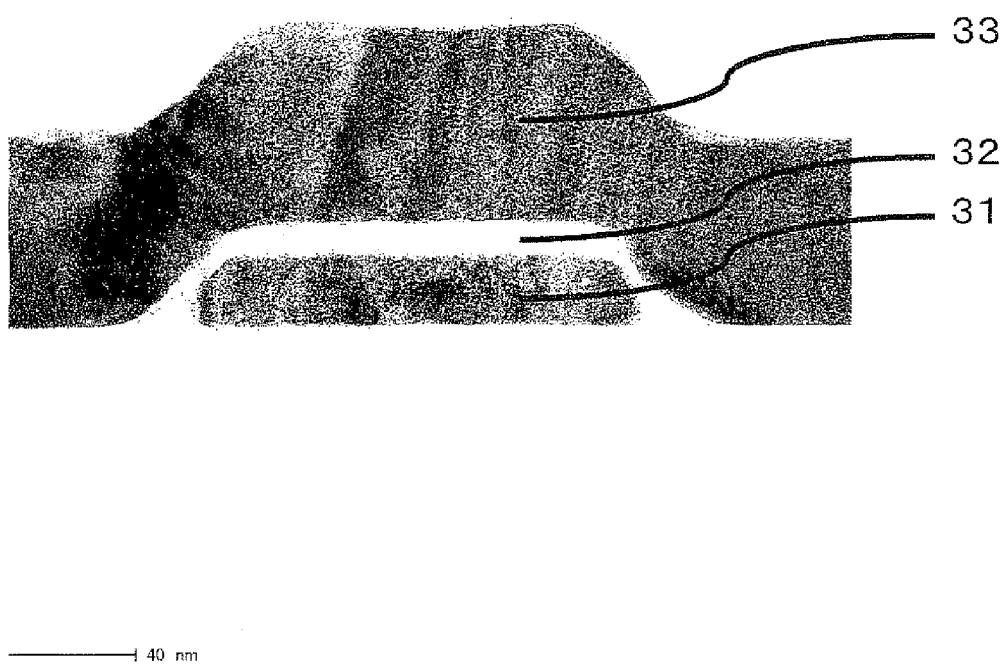
FIG. 3 is a diagram showing a cross-sectional trans-mission electron micrograph of the spin injector electrode in the spin accumulation device of an example.

Oxygen Vacancies in the MgO Layer:

FIG. 3 shows a cross-sectional image of the injection ferromagnet/MgO electrode (11 in FIG. 2) measured by transmission electron microscope (TEM). It can be seen that the MgO layer 32 evenly covers the NiFe thin wire 31. The composition of this MgO layer is analyzed by Energy Dispersive X-ray spectrometry (EDX). Oxygen ratio decreases 6% after annealing.

Figure 4:
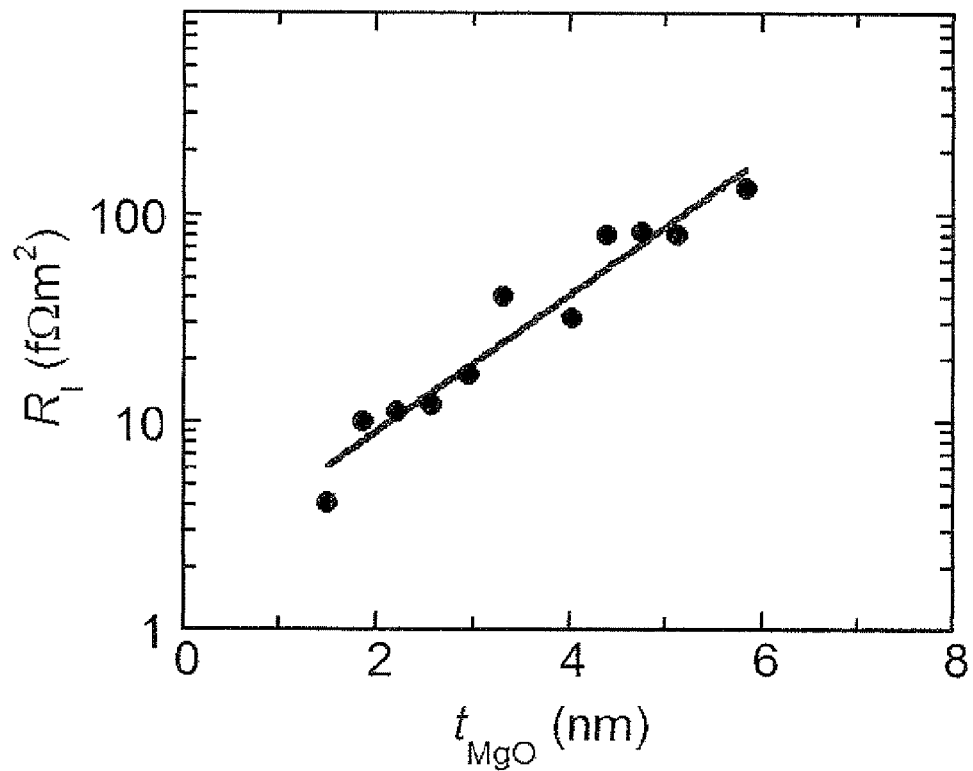
FIG. 4 is a diagram showing the thickness dependence of the interface resistance of MgO film in the spin accumulation device of an example.

Interface Resistance in the MgO Layer:

FIG. 4 shows the MgO thickness dependence of the NiFe/MgO/Ag interface resistance in the spin accumulation device of FIG. 2, measured by connecting a current source between the terminal 14 and terminal 16 and connecting a voltmeter between the terminal 18 and terminal 13. The dependence of the interface resistance $R_I$ on thickness $t_{MgO}$ can be expressed by exponential function.

$$R_I(\text{f}\Omega\text{m}^2) \propto e^{0.76 t_{MgO}(nm)} \quad \text{(Eq. 1)}$$

The solid line in FIG. 4 is a fitting line calculated from the experimental values. In addition, the current-voltage characteristic of the interface is linear, and thus the MgO film has electric conductivity.

Figure 5:
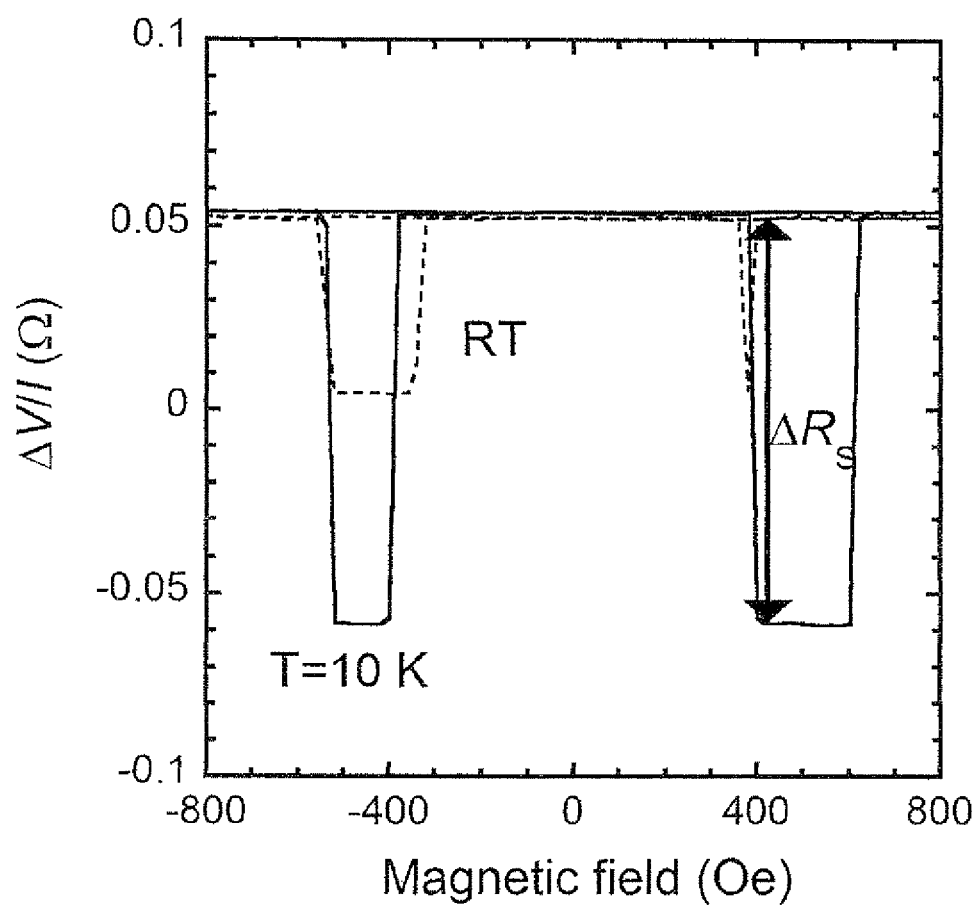
FIG. 5 shows spin accumulation resistance changes as a result of a spin injection experiment using the spin accumulation device of an example.

Spin Accumulation Amount:

A spin injection experiment is performed. In the spin injection experiment, a current source is connected between the terminal 14 and terminal 18 and a current of 0.2 mA is applied. The spin current is injected into the nonmagnet 33 from the ferromagnet 31 through the MgO layer 32. Then, the spin current diffuses in the nonmagnet thin wire toward the detection electrode 12. Hence, by connecting a voltmeter between the terminal 13 and terminal 15, a signal according to the spin direction of the accumulation and to the magnetization direction of the spin detection ferromagnet electrode 12 can be detected. The result is shown in FIG. 5. FIG. 5 shows measurement results at low temperature (10 K, solid line) and room temperature (RT=300 K, dashed line).

By changing the magnetic field, magnetization direction of the spin injector electrode 11 and spin detector electrode 12 is varied. At first, high magnetic field of about 1000 Oe is applied along the ferromagnet thin wire direction. At this time, the magnetization direction of the ferromagnets in the spin injector electrode 11 and spin detector electrode 12 is along the direction of the magnetic field. Decreasing the magnetic field to zero and then applying it in opposite direction, the magnetization of the detector electrode 12 is reversed at −400 Oe. Because of this, it can be seen that, resistance value becomes smaller. Then, further increasing the magnetic field, the magnetization of the injector electrode 11 is reversed to the magnetic field direction at about −500 Oe, and the electrode is returned to high resistance state. After the magnetization of both ferromagnets is reversed, the magnetic field is increased toward positive direction. Then, the magnetization of the detector electrode 12 is reversed at about 400 Oe, and further the magnetization of the injector electrode 11 is reversed at about 600 Oe. The voltage change ΔV due to the relative magnetization configuration of parallel and anti-parallel is proportional to the spin accumulation amount in the nonmagnet. In order to increase ΔV=ΔRs×I, it is preferable to apply large current and to employ a device with large resistance change (spin accumulation resistance change).

As can be seen from FIG. 5, the spin accumulation device of this example exhibits large spin accumulation resistance changes ΔRs: about 100 mΩ at a low temperature (10K) and about 50 mΩ even at the room temperature (300K).

Figure 6:
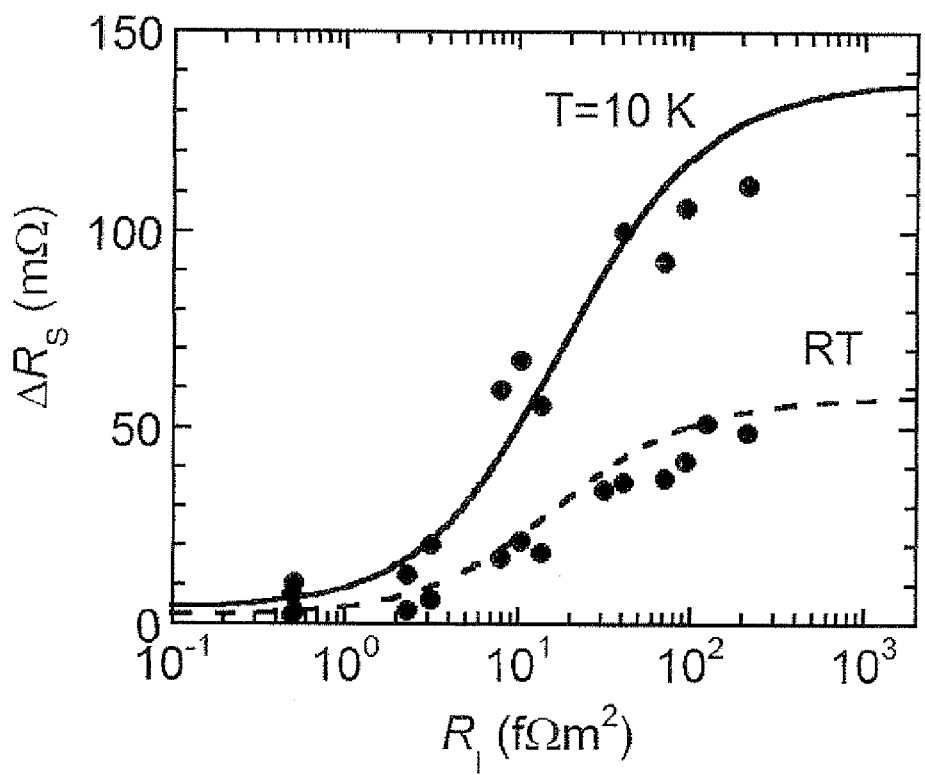
FIG. 6 is a diagram showing dependencies of the spin accumulation resistance change against MgO film interface resistance in the spin accumulation device of an example.

In order to study the MgO film interface resistance dependence of the spin accumulation resistance change ΔRs, the spin accumulation resistance changes are measured for several devices having different MgO film thickness. The result is shown in FIG. 6. Takahashi and Maekawa (2003) have reported the theoretical formula of ΔRs using one-dimensional spin current circuit model, which is given below.

$$\Delta R_S = 2R_{SN} \frac{\left(P_i \frac{R_{SI}}{R_{SN}} + P_F \frac{R_{SF}}{R_{SN}}\right)^2 e^{-\frac{d}{\lambda_N}}}{\left(1 + 2\frac{R_{SI}}{R_{SN}} + 2\frac{R_{SF}}{R_{SN}}\right)^2 - e^{-\frac{2d}{\lambda_N}}} \quad (\text{Eq. 2})$$

Here, $R_{SN}$ is the spin resistance of Ag (nonmagnet), $P_i$ is the spin polarization of the MgO interface, $R_{SI}$ is the spin resistance of the MgO interface, $P_F$ is the spin polarization of the NiFe (ferromagnet), $R_{SF}$ is the spin resistance of NiFe, d is the distance between the spin injector electrode and spin detector electrode, and $\lambda_N$ is the spin relaxation length of Ag. $R_{SN}$, $R_{SI}$ and $R_{SF}$ are represented as follows, respectively.

$$R_{SN} = \frac{2\rho_N \lambda_N}{t_N w_N} \quad (\text{Eq. 3})$$

$$R_{Si} = \frac{2R_i}{w_F w_N}\left(\frac{1}{1-P_i^2}\right) \quad (\text{Eq. 4})$$

$$R_{SF} = \frac{2\rho_F \lambda_F}{w_F w_N}\left(\frac{1}{1-P_F^2}\right) \quad (\text{Eq. 5})$$

Here, $\rho_N$ is Ag resistivity, $t_N$ is Ag thickness, $w_N$ is the width of the Ag thin wire in which spin is accumulated, $R_i$ is MgO interface resistance, w is the width of the NiFe thin wire, $\rho_F$ is NiFe resistivity, and $\lambda_F$ is the spin diffusion length of NiFe. The resistance and thin wire width for each material can be obtained by experiments. $P_F$, $\lambda_F$, $P_i$, and $\lambda_N$ are calculated as fitting parameters for the experiment result of FIG. 6.

In FIG. 6, the points represent experiment, and the lines represent the theoretical curves. The results at room temperature are $P_F$=0.3, $\lambda_N$=5 nm, $P_i$=0.45, and $\lambda_N$=300 nm, and at a low temperature of 10 K are $P_F$=0.35, $\lambda_F$=5 nm, Pi=0.45, and $\lambda_N$=1100 nm. It should be noted that the spin injection source of the present invention exhibits Pi of 0.45 which is more than twice as large as the conventional spin accumulation device using tunnel junction which has Pi of about 0.2. Also, Pi of the injection source is larger than the comparative example using a low-resistance MgO film without annealing, which will be described later. Since large Pi means high spin injection efficiency, the spin injection source of the present invention is shown to have high performance.

Figure 7:
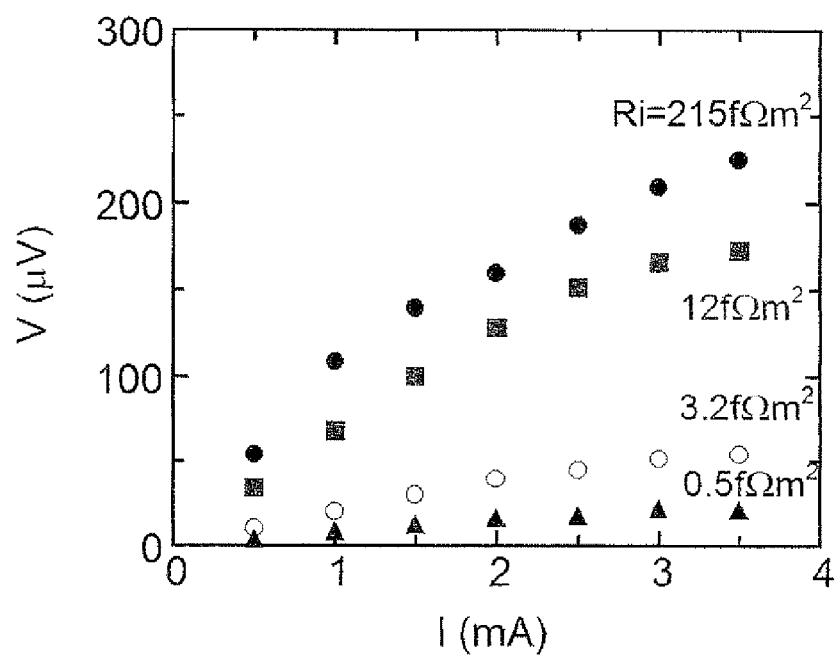
FIG. 7 is a diagram showing applied current dependencies of the spin accumulation amount $\Delta V$ in the spin accumulation device of an example.
Figure 8:
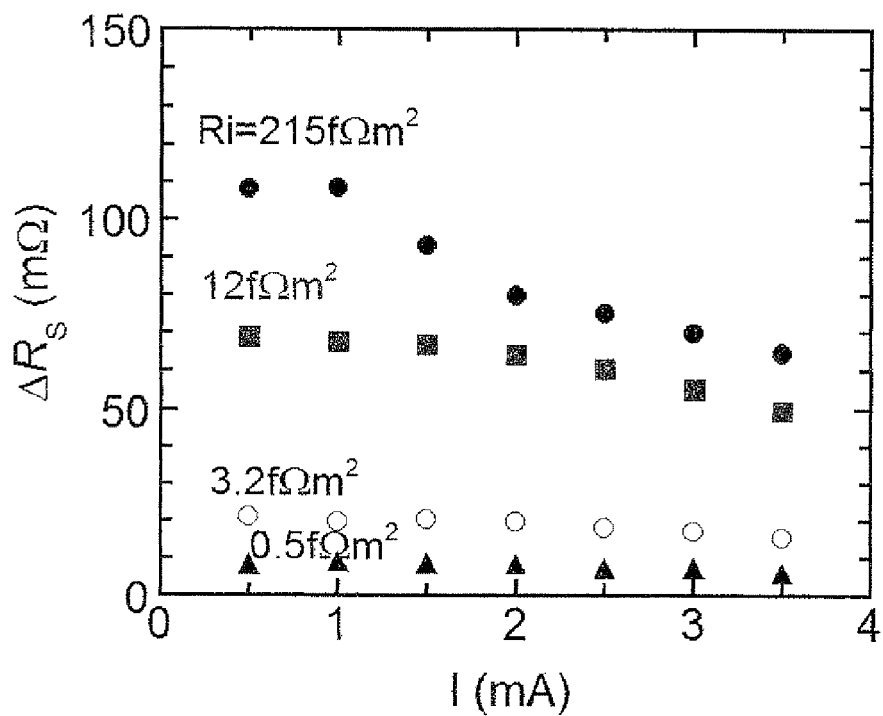
FIG. 8 is a diagram showing applied current dependencies of the spin accumulation resistance change $\Delta R_S$ in the spin accumulation device of an example.

FIG. 7 and FIG. 8 show the applied current dependence of the spin accumulation amount ΔV and ΔRs (=ΔV/I) in these spin accumulation devices. The interface resistances of 0.5 fΩm², 3.2 fΩm², 12 fΩm², and 215 fΩm² correspond to MgO layer thicknesses of 0 nm, 1.2 nm, 2.5 nm, and 6.2 nm, respectively. As can be seen from FIG. 7, ΔV increases gradually with the applied current I. FIG. 8 shows the current dependence of $\Delta R_S$. In all the devices, $\Delta R_S$ does not depend significantly on the current until 1 mA. In conventional tunnel junctions, $\Delta R_S$, sharply decreases at 1 μA (S. O. Valenzuela and M. Tinkham, "Spin polarized tunneling in room-temperature mesoscopic spin valves", Applied Physics Letters, vol. 85, 5914 (2004)). Hence, the current dependence improves significantly in the spin injection source of the present invention as compared with conventional tunnel junctions.

Figure 9:
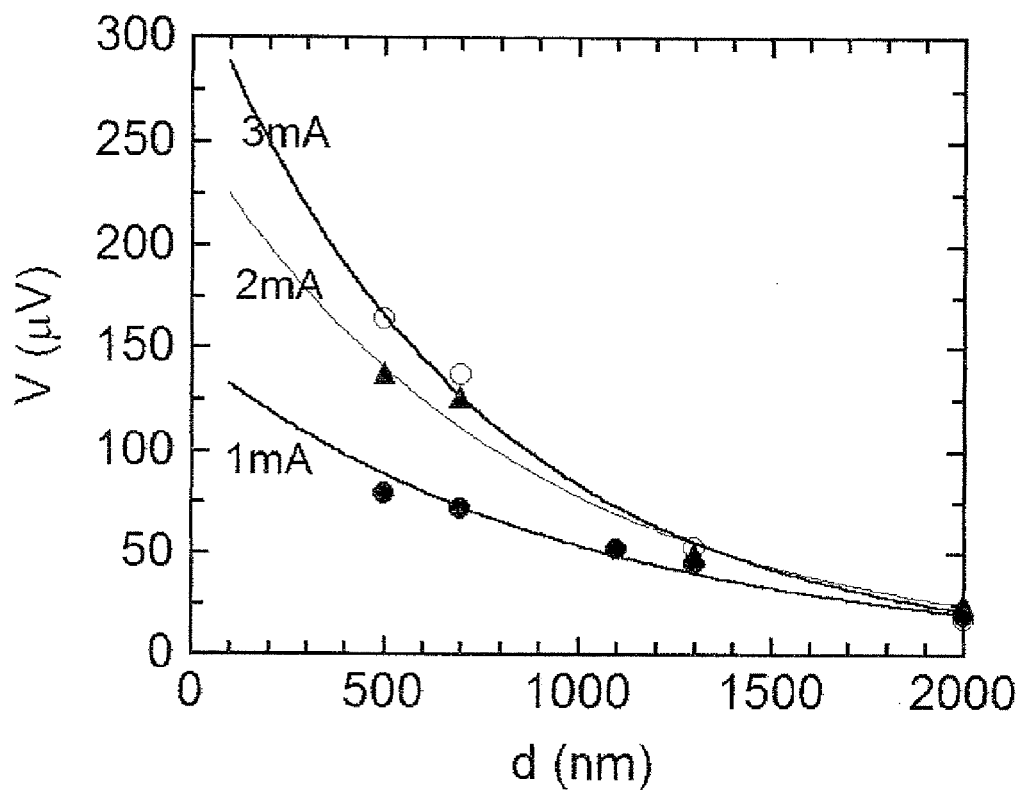
FIG. 9 is a diagram showing dependencies of spin accumulation amount $\Delta V$ against applied current and distance between the spin injection electrode and the spin detection electrode in the spin accumulation device of an example.
Figure 10:
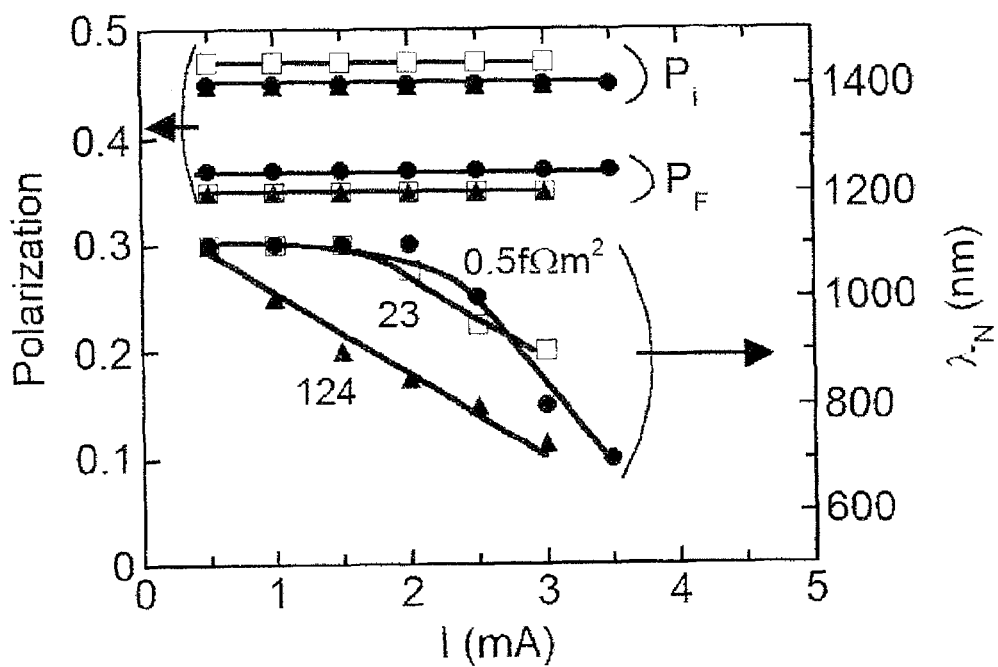
FIG. 10 is a diagram showing applied current dependencies of the spin polarization of the MgO interface and the spin diffusion length of silver in the spin accumulation device of an example.

Now, in order to elucidate the decrease of $\Delta R_S$ with the increase of the applied current, ΔV characteristics of the spin accumulation device having interface resistance of 124 fΩm² (MgO film thickness 5.5 nm) is examined and is fitted by the theoretical formula. One of the results is shown in FIG. 9 and FIG. 10. In FIG. 9, the points represent experiment, and the lines represent the theoretical formulae. FIG. 10 shows the applied current dependence (left scale) of the spin polarization of the MgO interface and ferromagnet, and the spin relaxation length (right scale) of the nonmagnet. It can be found that, in either device, the spin polarizations of NiFe ($P_F$=0.35) and MgO interface (Pi=0.45) do not depend on the applied current, and thus the decrease of $\Delta R_s$ is due to the decrease of the spin relaxation length of Ag. In other words, the spin injection source of the present invention has no applied bias dependence and is highly stable.

In conclusion, the spin injection source of the present invention has high spin injection efficiency (spin polarization Pi is more than twice larger than conventional tunnel junctions), and the spin injection efficiency is maintained even with a large current (up to 1 mA) applied. Since, as stated before, the spin injection amount (amount of accumulation) is proportional to the product of the applied current and spin polarization, the spin accumulation device using the spin injection source of the present invention has the spin accumulation amount of about 100 μV (spin accumulation resistance change $\Delta R_S$ is about 100 mΩ, and applied current is 1 mA), and the signal intensity is larger by one or more orders compared to about 10 μV of conventional tunnel junctions.

COMPARATIVE EXPERIMENTAL EXAMPLE

Figure 11:
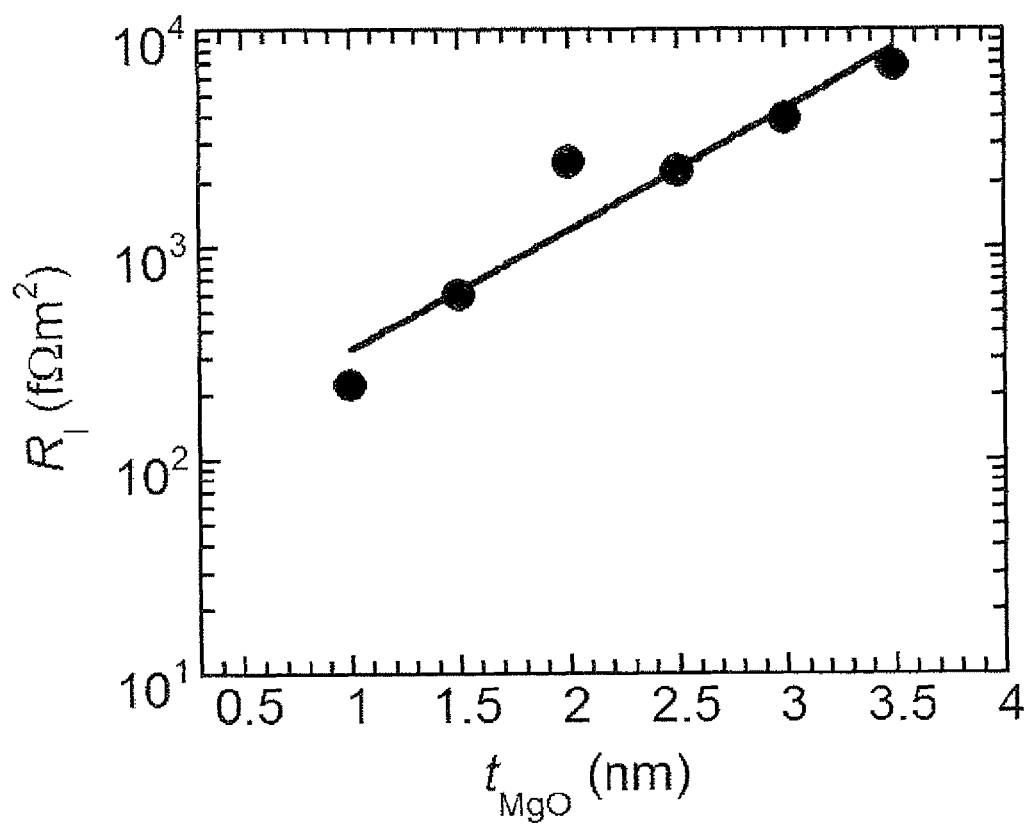
FIG. 11 is a diagram showing a thickness dependence of the interface resistance of the MgO film in the spin accumulation device of a comparative example (without annealing)

A device having same shape and material is prepared without annealing (spin injection source described in Fukuma et. al. (2010)). The MgO layer of the device has comparatively small oxygen vacancies, and thus is in comparatively high resistance state. Note here that "high resistance" is in terms of a comparison with the annealed MgO layer, and the MgO layer of the comparative example has lower resistance and more conductivity compared with the MgO layer used in a conventional tunnel junction. The MgO film thickness dependence of the interface resistance in the comparative example is shown in FIG. 11. In FIG. 11 the solid line represents the fitting line from the experiment values. The thickness dependence of the interface resistance follows an exponential function.

$$R_1(f\Omega m^2) \propto e^{1.3 t_{MgO}(nm)} \quad \text{(Eq. 6)}$$

Figure 12:
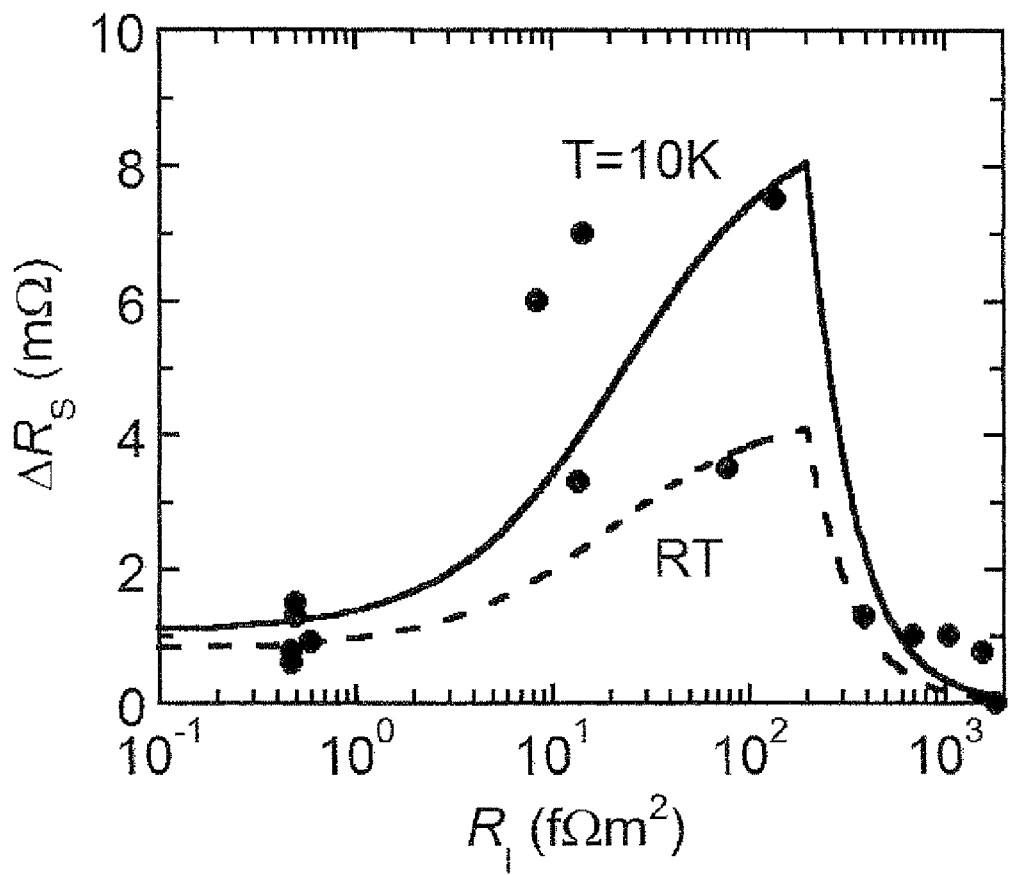
FIG. 12 is a diagram showing applied current dependence of the spin accumulation resistance change $\Delta R_S$ in the spin accumulation device of a comparative example (without annealing)

FIG. 12 shows the interface resistance dependence of $\Delta R_S$ in this device. It can be found that in the device having a high-resistance MgO interface, $\Delta R_S$ sharply decreases in the region where the MgO film thickness is more than 1 nm or the interface resistance is more than 100 f$\Omega$m². Also, this device has the MgO interface spin polarization of 0.11, which is about same as conventional tunnel junctions but much smaller than spin polarization of the MgO interface according to the present invention. Consequently, the spin injection efficiency is low, and $\Delta R_S$ is small in this device.

OTHER EXAMPLES

Figure 13:
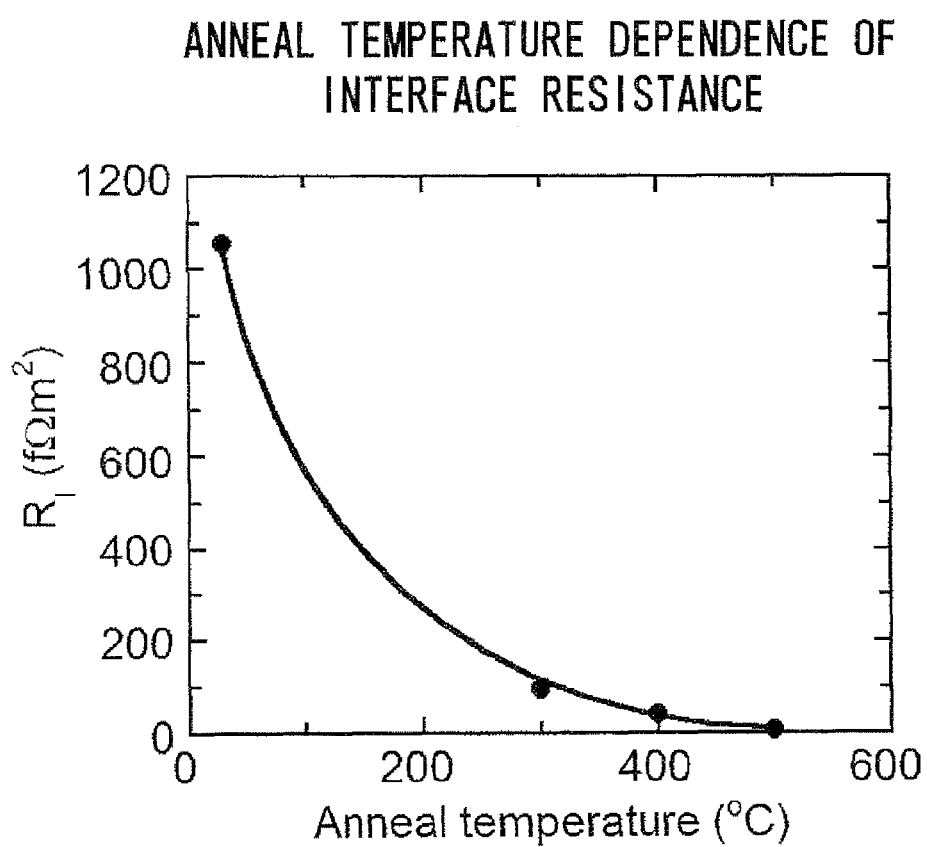
FIG. 13 is a diagram showing a relationship between the annealing temperature and the interface resistance of the MgO film.

Other spin accumulation device having same shape and material are prepared. The devices have 2 nm thick MgO layer. After the preparation, the devices are annealed in nitrogen (97%)+hydrogen (3%) atmosphere for 30 minutes at 300° C., 400° C., and 500° C., respectively. FIG. 13 shows the result of the resistance measurements of the NiFe/MgO/Ag interface in the spin injection electrode after annealing. Before the annealing the interface has a high resistance of 1055 f$\Omega$m², but after the annealing the interface resistance considerably decreases to 94 f$\Omega$m² at 300° C., 41 f$\Omega$m² at 400° C., and 5 f$\Omega$m² at 500° C.

Figure 14:
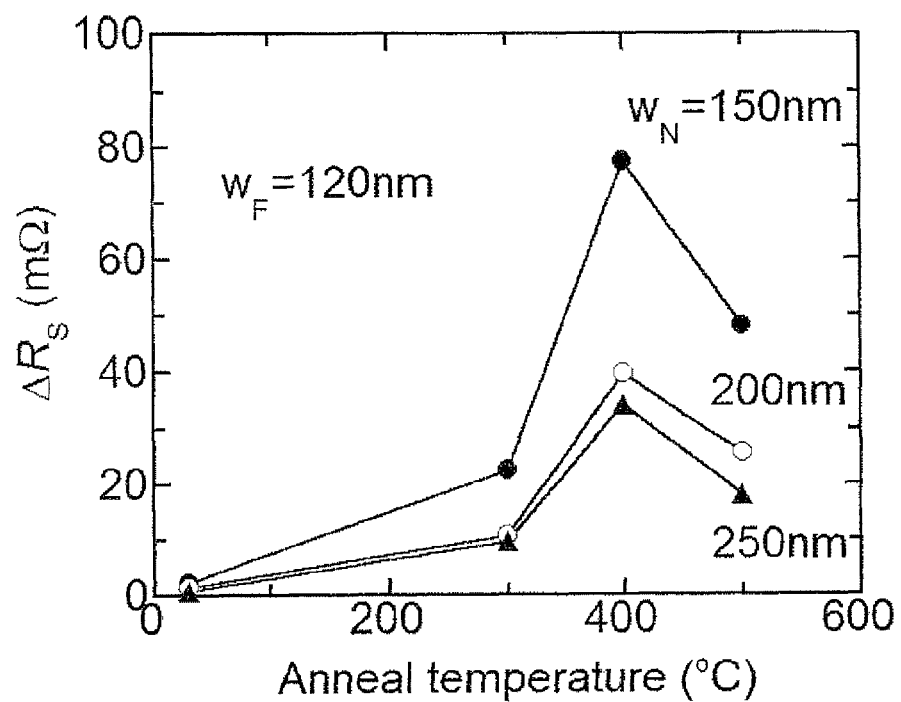
FIG. 14 is a diagram showing relationships between the annealing temperature and the spin accumulation resistance change.

A spin injection experiment is conducted for these devices. The annealing temperature dependence of $\Delta R_S$ at a low temperature of 10 K is shown in FIG. 14. Here, the ferromagnet thin wire width is fixed at 120 nm and the nonmagnet thin wire width for the spin accumulation is varied as 150 nm, 200 nm, and 250 nm to estimate the effect of junction size of the MgO interface. High-resistance devices before annealing have small signal intensities of about 0.6 m$\Omega$, but $\Delta R_S$ increases gradually with increase of annealing temperature, and $\Delta R_S$ decreases when annealed at 500° C.

Figure 15:
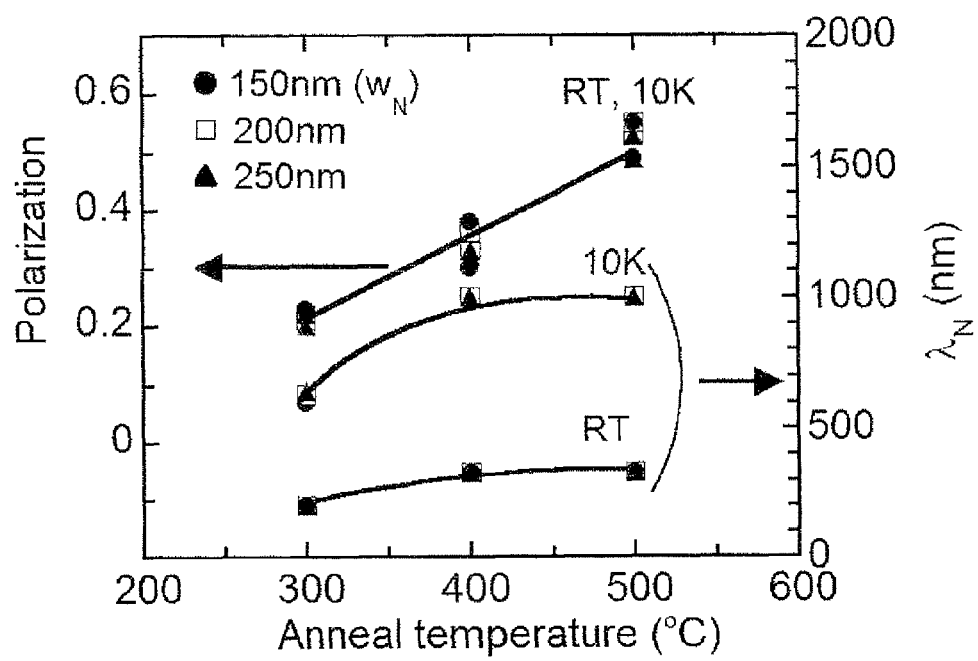
FIG. 15 is a diagram showing relationships between the annealing temperature and the spin diffusion length of silver or the spin polarization of the MgO interface.

The spin polarization Pi of the interface is determined, as above, by measuring $\Delta R_S$ for various devices having different distance between detection electrode and spin injection electrode and comparing with one-dimensional spin current circuit model. The result is shown in FIG. 15. The spin polarization of the MgO interface Pi increases with annealing temperature. The spin polarization is Pi=0.22 at 300° C., Pi=0.33 at 400° C., and Pi=0.53 at 500° C. Note that the measurement signal before the annealing is too small to determine spin polarization. Also, the spin diffusion length of silver increases with the annealing temperature, because the electrical resistivity of silver decreases by annealing.

As can be seen, annealing the prepared MgO film, increases the spin accumulation resistance change $\Delta R_S$. Since $\Delta R_S$ takes its maximum at 400° C. annealing, the optimum annealing temperature is between 300° C. and 500° C. The reason why $\Delta R_S$ decreases even though the spin polarization of the MgO interface increases after annealing at 500° C., is that the interface resistance is as small as 5 f$\Omega$m². Needless to say, after the annealing at 500° C., $\Delta R_S$ exhibits substantially large value, and it can be said that annealing at more than 500° C. achieves a significant effect compared with those without annealing. However, it is preferable that the interface resistance is sufficiently high to achieve desired effect, and the interface resistance is preferably 10 f$\Omega$m² or more in order to realize a large spin accumulation in the spin accumulation device.

Furthermore, when the thickness is made 2 nm in the above-described example, the interface resistance is 8.8 f$\Omega$m² (Eq. 1, FIG. 4) and its spin polarization is Pi=0.45. On the other hand, when the thickness is made 2 nm in the comparative example, the interface resistance is 1181 f$\Omega$m² (Eq. 6, FIG. 11) and its spin polarization is Pi=0.11.

Consequently, the relationship between the interface resistance and spin polarization when the thickness is 2 nm can be summarized as shown in the below table.

|  | Before Annealing | 300° C. | 400° C. | 500° C. | Example with Annealing (Converted to 2 nm) | Comparative Example without Annealing (Converted to 2 nm) |
| --- | --- | --- | --- | --- | --- | --- |
| Interface Resistance | 1055 | 94 | 41 | 5 | 8.8 | 1181 |
| Spin Polarization | — | 0.22 | 0.33 | 0.53 | 0.45 | 0.11 |

In order to achieve the spin polarization of 0.2 or more, which is sufficiently larger than 0.11 the comparative example, the interface resistance needs to be 5 to 90 f$\Omega$m² in low-resistance MgO film with thickness of 2 nm. Here, 2 nm thickness is only an example and the thickness of the low-resistance MgO film is not limited to 2 nm. In general, the relationship between the interface resistance Ri and film thickness t of the low-resistance MgO film can be represented by two parameters such as Ri=b×exp(at). Here, a and b correlate each other, and a tends to decrease as b decreases. When the thickness is 2 nm and the interface resistance is 5 f$\Omega$m², a may be estimated as a=0.7, and when the thickness is 2 nm and the interface resistance is 90 f$\Omega$m², a may be estimated as a=1.2. Thus, by using the low-resistance MgO film in which the interface resistance $R_I$ (f$\Omega$m²) and thickness t (nm) satisfy the following relationship, the spin polarization of 0.2 or more can be achieved.

$$R_1 \propto e^{\alpha-1}, 0.7 \leq \alpha \leq 1.2$$

Figure 16:
FIG. 16 is a diagram showing a cross-sectional TEM image (A) of the annealed spin accumulation device and area analysis results (B-E) of the low-resistance MgO films compositions.
Figure 16:
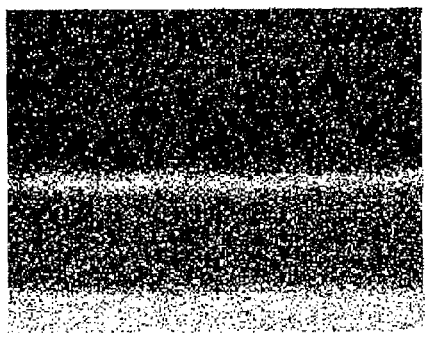
Figure 16:
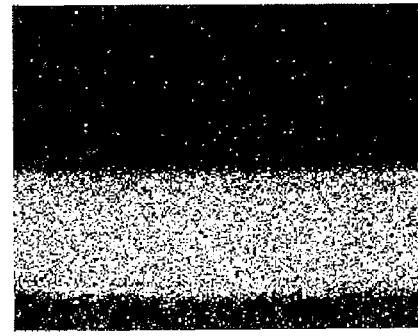
Figure 16:
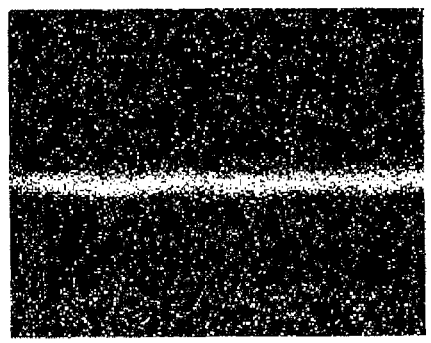
Figure 16:
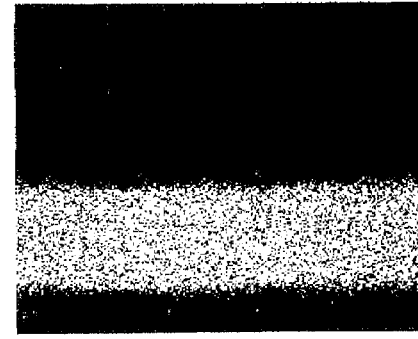

Also, composition analysis of MgO in these devices is carried out by EDX. Since it is extremely difficult to exactly measure the composition of Mg and O in the MgO layer, qualitative analysis is performed. The oxygen vacancies exist in the samples before annealing, and the composition of the MgO layer is assumed as $MgO_{1-\delta}$. After annealing at 300° C., 400° C., and 500° C., the composition changes respectively to $MgO_{1-(\delta+0.03)}$, $MgO_{1-(\delta+0.06)}$, and $MgO_{1-(\delta+0.12)}$. Thus, it becomes apparent that oxygen vacancies have significant influence on the decrease of interface resistance by annealing. Also, FIG. 16 shows a cross-sectional TEM image (A) of the sample annealed at 500° C. and the results of area analysis of composition (B to E). With annealing at 400° C., no diffusion of Fe and Ni into MgO can be found, but in the sample annealed at 500° C. the diffusion of Fe atoms into the MgO layer can be clearly seen. The diffusion of small amount of metallic atoms during annealing or preparation of the MgO layer in this way is an effective way to decrease the interface resistance of MgO.

It is difficult to measure the amount of oxygen vacancies exactly before annealing, but since MgO crystal lattices can be seen in the TEM image, the oxygen amount does not change substantially. The amount of oxygen vacancies I before annealing is considered to be about 2% to 5% by a broad estimation. Hence, the amounts of oxygen vacancies of the MgO film after annealing are considered to be 5% to 8%, 8% to 11%, and 14% to 17% for annealing temperature of 300° C., 400° C., and 500° C. respectively. In other words, in the spin accumulation device which the efficiency is improved by annealing, the oxygen vacancies of the MgO film is 5% to 17%

<Miscellaneous>

Interposition of the low-resistance MgO film in the spin injection source of the present invention improves the spin injection efficiency, because the MgO film overcomes the spin resistance mismatch between the nonmagnet and ferromagnet. The spin resistance of the MgO film is preferably same as or more than the spin resistance of the nonmagnet to which the spin is injected. Since the spin resistance is represented by Eq.3 to Eq. 5, the interface resistance Ri of the MgO film should be adjusted according to the characteristics (resistivity or spin diffusion length) of the nonmagnet to which the spin is injected in order to obtain proper spin resistance. When the spin injection target is a nonmagnet metal, its characteristics such as the resistivity and spin diffusion length are more or less constant, and as can be seen from FIG. 6, the interface resistance of MgO should be 1 $f\Omega m^2$ or more, or more preferably 10 $f\Omega m^2$ or more. The upper limit of the interface resistance MgO is preferably $10^3$ $f\Omega m^2$ or less, at which the interface resistance dependence of the spin accumulation resistance change saturate.

Also, if the thickness of the low-resistance MgO film is too thin, the spin injection efficiency is not expected to improve very much since it cannot properly fulfill the function of a spin filter. In order to properly fulfill the function of a spin filter, the thickness should be 1 nm or more, or more preferably 2 nm or more. There is no upper limit for the thickness in terms of the spin filter functionality, and any thickness is employable as long as the interface resistance of MgO film falls within the above-described range, but in practice the upper limit is preferably about 10 nm.

It should be noted that decreasing the interface resistance of the low-resistance MgO film leads to improvement for the spin injection efficiency. As described above, one of simple and preferable manufacturing methods introduce some oxygen vacancies when preparing the MgO film and then anneal it in hydrogen atmosphere or vacuum to introduce more oxygen vacancies. Here, introducing oxygen vacancies when preparing the MgO film makes it easier to introduce oxygen vacancies by annealing. However, the MgO film may be made by any manufacturing method other than the above method, as long as necessary conductivity can be obtained. For example, one possible way is to adjust preparation condition of the MgO film to obtain MgO film having proper oxygen vacancies (interface resistance), without annealing. Also, oxygen vacancies may not be introduced when preparing the MgO film, and the oxygen vacancies may be introduce by annealing only. Furthermore, the interface resistance of MgO film may be decreased by diffusing metallic atoms in the MgO film.

The spin accumulation device of the example (FIG. 2) employs an annealed MgO film as the spin detector electrode 12, but the spin detector electrode may employ conventional tunnel junction or ohmic junction depending on the purpose of the device function.

What is claimed is:

1. A spin injection source for injecting spin from a ferromagnet to a nonmagnetic conductor, comprising:
a nonmagnetic conductor;
a MgO film formed on the nonmagnetic conductor; and
a ferromagnet formed on the nonmagnetic conductor;
wherein an interface resistance $R_I$ ($f\Omega m^2$) and a thickness t (nm) of the MgO film satisfy the following relationship:

$$R_1 \propto e^{\alpha \cdot t}, 0.7 \le \alpha \le 1.2.$$

2. The spin injection source according to claim 1, wherein the MgO film has spin polarization of from 0.2 to 0.53.

3. A spin injection source for injecting spin from a ferromagnet to a nonmagnetic conductor, comprising:
a nonmagnetic conductor;
a MgO film formed on the nonmagnetic conductor; and
a ferromagnet formed on the nonmagnetic conductor;
wherein the MgO film has an interface resistance of 1 to $10^3$ $f\Omega m^2$ and a thickness of 2 nm or more.

4. The spin injection source according to claim 3, wherein the MgO film has spin polarization of from 0.2 to 0.53.

* * * * *